United States Patent [19]
Shiraishi et al.

[11] Patent Number: 5,939,130
[45] Date of Patent: Aug. 17, 1999

[54] COATING FILM FORMING METHOD AND COATING FILM FORMING APPARATUS

[75] Inventors: Masatoshi Shiraishi, Kikuchi; Yukio Kiba, Kumamoto-ken; Kunie Ogata, Yokohama, all of Japan

[73] Assignee: Tokyo Electron Limited, Tokyo, Japan

[21] Appl. No.: 08/863,427

[22] Filed: May 27, 1997

[30] Foreign Application Priority Data

May 28, 1996 [JP] Japan .................................. 8-156176
Sep. 11, 1996 [JP] Japan .................................. 8-262391

[51] Int. Cl.$^6$ ...................................................... B05D 3/12
[52] U.S. Cl. .................................... 427/9; 427/8; 427/10; 427/240; 427/385.5; 118/52; 118/665; 118/666; 118/667; 118/712; 437/231
[58] Field of Search ................................ 427/240, 9, 10, 427/8, 385.5; 118/52, 665, 666, 667, 712; 437/231

[56] References Cited

U.S. PATENT DOCUMENTS 5,393,624  2/1995  Ushijima .................................. 430/30

FOREIGN PATENT DOCUMENTS 0 595 749  5/1994  European Pat. Off. .
2-39520    2/1990  Japan .
7-97548   10/1995  Japan .

OTHER PUBLICATIONS

Patent Abstracts of Japan, vol. 8, No. 285 (E–287), Dec. 26, 1984, JP 59–151424, Aug. 29, 1984.
Patent Abstracts of Japan, vol. 017, No. 262 (P–1541), May 24, 1993, JP 05–002777, Jan. 8, 1993.
Patent Abstracts of Japan, vol. 015, No. 423 (E–1127), Oct. 28, 1991, JP 03–178123, Aug. 2, 1991.
T. E. Metz, et al., Semiconductor International, vol. 15, No. 2, pp. 68 and 69, "In Situ Control of Photoresist Coating Processes", Feb. 1992.

*Primary Examiner*—Janyce Bell
*Attorney, Agent, or Firm*—Oblon, Spivak, McClelland, Maier & Neustadt, P.C.

[57] ABSTRACT

A coating film forming method for forming a resist coating film on an upper surface of a wafer held by a spin chuck in a chamber includes (a) the step of keeping preliminary correlation data representing correlation between a wafer rotating speed and the thickness of the resist coating film formed on the wafer in the chamber, (b) the step of conveying the wafer into the chamber and holding the wafer by the spin chuck, (c) the step of pouring the resist liquid onto the wafer and spin-rotating the wafer to form a resist coating film on the upper surface of the wafer, (d) the step of detecting the thickness of the formed resist coating film by a sensor, (e) the step of detecting a rotating speed of the spin chuck by a sensor, and (f) the step of, on the basis of the detected film thickness and the preliminary correlation data, correcting a set rotating speed of the spin chuck to feedback-control a resist coating process for a next wafer.

23 Claims, 7 Drawing Sheets

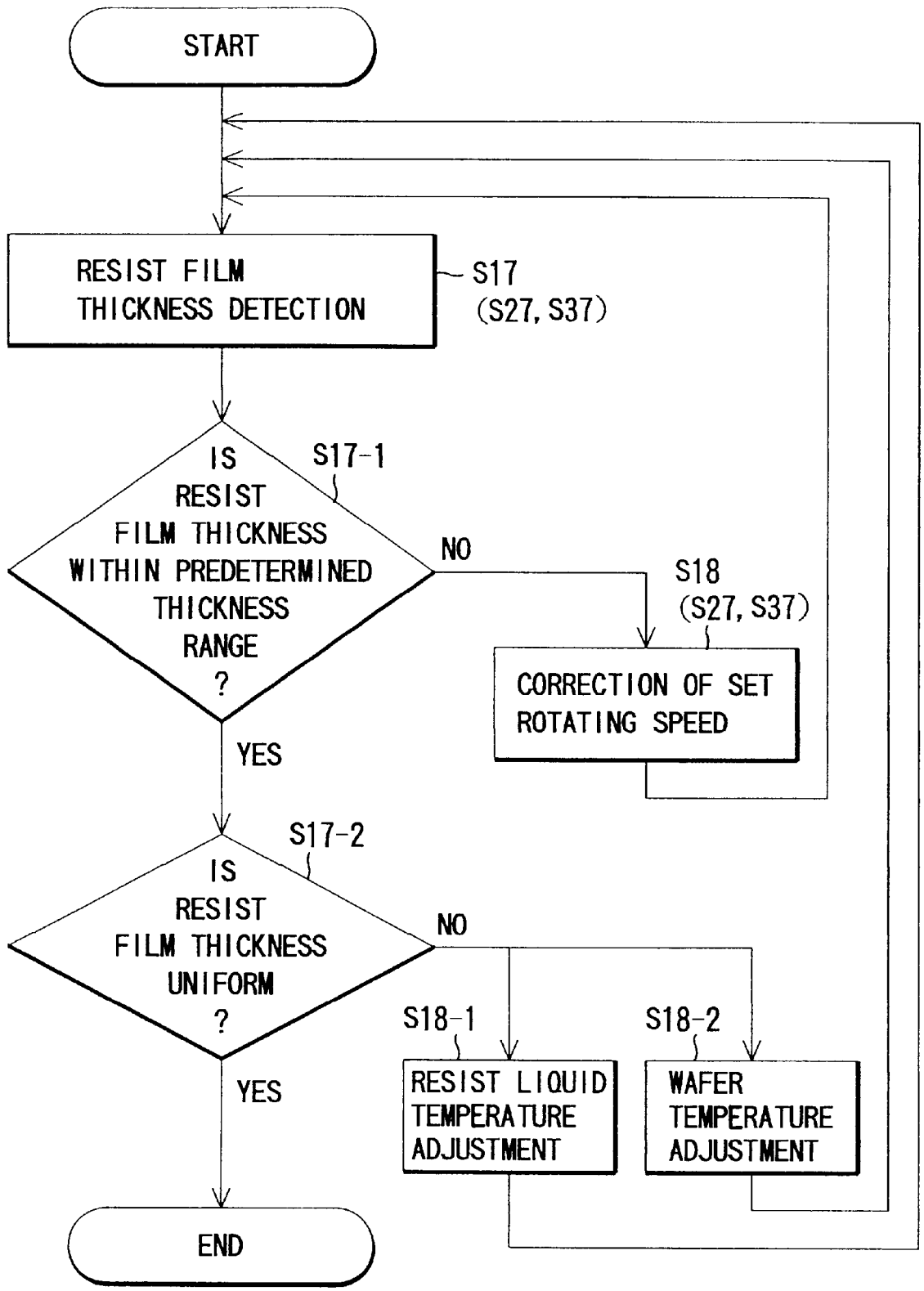
F I G. 5

COATING FILM FORMING METHOD AND COATING FILM FORMING APPARATUS

BACKGROUND OF THE INVENTION

The present invention relates to a coating film forming method and a coating film forming apparatus for coating a process liquid such as a photoresist liquid on a substrate such as a semiconductor wafer or an LCD glass substrate to form a coating film.

In manufacture of a semiconductor device, a photoresist liquid is coated on a semiconductor wafer to form a photoresist coating film, the photoresist coating film is exposed and then developed. Such a photolithography technique is a very important process in high integration of a semiconductor device. In order to uniformly form a photoresist film on a wafer surface in this process, the closest attention is paid, and a long period of time is spent.

As shown in FIG. 1, a conventional resist coating apparatus comprises a process vessel 2, a spin chuck 3, a cup 4, a resist liquid supply nozzle 5, a fan filter unit (FFU) 6, a temperature/humidity adjustment device 7, a temperature/humidity sensor 9a, and a controller 9. The process vessel 2 is partitioned from the atmosphere of a wafer convey section 1 by a panel. A spin chuck 3 is arranged in the process vessel 2. The spin chuck 3 vertically moves along a Z axis to be able to rotate about the Z axis by θ. The cup 4 is arranged to surround the outer periphery and lower portion of the spin chuck 3, and a gas outlet port 4a and a liquid outlet port 4b are formed in the bottom portion of the cup 4. The resist liquid supply nozzle 5 is designed to discharge (supply) a resist liquid toward a wafer W held on the spin chuck 3. The FFU 6 comprises a fan 6a and a filter 6b for supplying clean air into the process vessel 2. The temperature/humidity adjustment device 7 is designed to adjust the temperature and humidity of the air in the process vessel 2. The temperature/humidity sensor 9a is arranged near the FFU 6 and connected to the input side of the controller 9.

In the resist coating apparatus arranged as described above, a wafer W is conveyed into the process vessel 2 by the convey arm mechanism 8, is held by adsorption of the spin chuck 3, and is spin-rotated. A resist liquid is supplied from the nozzle 5 to the wafer W while the wafer W is spin-rotated to coat a resist on the wafer W. Furthermore, the spin chuck 3 is rotated at a high speed, a resist liquid is uniformly diffused on the entire surface of the wafer W to form a resist coating film having a desired thickness. During this process, the temperature and humidity of the internal atmosphere of the process vessel 2 are detected by the temperature/humidity sensor 9a, and these detection signals are sent to the controller 9. The temperature/humidity adjustment device 7 is controlled by the controller 9 to supply clean air whose temperature and humidity are adjusted from the temperature/humidity adjustment device 7 into the process vessel 2, so that the process atmosphere is kept in a desired state. After the resist coating film is formed as described above, the rotating speed of the spin chuck 3 is reduced, and thinner is poured onto the rear surface of the wafer W. The wafer is rotated at a high speed again, the thinner and coated resist are centrifugally removed from the rear surface of the wafer W.

However, in the conventional coating film forming apparatus, the temperature/humidity adjustment device 7 outside the process station, and the temperature/humidity adjustment device 7 is connected to the coating film forming apparatus through a pipe 7a. For this reason, the apparatus increases in size.

When only the temperature and humidity of the processing atmosphere are adjusted, not only the film thickness cannot be made uniform at high precision, but also air whose humidity is adjusted is forcibly supplied. For this reason, air flow in the processing atmosphere is disturbed, and the uniformity of the film thickness is adversely affected.

BRIEF SUMMARY OF THE INVENTION

It is an object of the present invention to provide a coating film forming method and a coating film forming apparatus in which the apparatus can be decreased in size and the thickness of a resist coating film is made uniform and highly precise.

A coating film forming method according to the present invention is a coating film forming method for forming a resist coating film on an upper surface of a substrate held by a spin chuck in a chamber, characterized by comprising: (a) the step of keeping preliminary correlation data representing correlation between the conditions, i.e., a rotating speed of the substrate, the temperature of a resist liquid to be coated, and the temperature of the upper surface of the substrate and the thickness of the resist coating film formed on the substrate in the chamber; (b) the step of conveying the substrate into the chamber and holding the substrate by the spin chuck; (c) the step of pouring the resist liquid onto the substrate and spin-rotating the substrate to form a resist coating film on the upper surface of the substrate; (d) the step of detecting the thickness of the resist coating film formed on the upper surface of the substrate by film thickness detection means; and (e) the step of, on the basis of detected film thickness information and the preliminary correlation data, correcting a set rotating speed of the spin chuck, the temperature of a resist liquid to be coated on a next substrate, and the temperature of an upper surface of the next substrate to feedback-control the resist coating step for the next substrate.

A coating film forming method according to the present invention is a coating film forming method for forming a resist coating film on an upper surface of a substrate held by a spin chuck in a chamber, characterized by comprising: (A) the step of keeping preliminary correlation data representing correlation between the conditions, i.e., a rotating speed of a dummy substrate, the temperature of a resist liquid to be coated, and the temperature of the upper surface of the dummy substrate and the thickness of a resist coating film formed on the dummy substrate; (B) the step of conveying the product substrate into the chamber and holding the product substrate by the spin chuck; (C) the step of pouring the resist liquid onto the product substrate and spin-rotating the product substrate to form a resist coating film on the upper surface of the product substrate; (D) the step of detecting the thickness of the resist coating film formed on the upper surface of the product substrate by film thickness detection means; and (E) the step of, on the basis of detected film thickness information and the preliminary correlation data, correcting a set rotating speed of the spin chuck, the temperature of a resist liquid to be coated on a next product substrate, and the temperature of the upper surface of the product substrate to feedback-control the resist coating step for the next product substrate.

The film thickness of the resist coating film is preferably detected immediately after the resist coating process is performed or after the substrate is cooled. Detection of the thickness of the resist coating film may be performed before the apparatus is operated, or may be performed every lot, i.e., twenty-five substrates. In addition, the thicknesses of the resist coating films of the substrates are detected, respectively, and the thickness of the coating films coated on the substrates which will be processed later on the basis of the detection information may be controlled.

A coating film forming apparatus according to the present invention, characterized by comprising: a chamber, a spin chuck, arranged in the chamber, for holding a substrate; a rotational drive means for spin-rotating the spin chuck; a resist liquid supply means for supplying a resist liquid to the substrate on the spin chuck; a film thickness sensor, arranged in the chamber, for detecting the thickness of a resist coating film formed on the upper surface of the substrate; first temperature adjustment means for adjusting the temperature of the resist liquid to be coated on the substrate; second temperature adjustment means for adjusting the temperature of the upper surface of the substrate; and control means for controlling the rotational drive means, the first temperature adjustment means, and the second temperature adjustment means on the basis of a film thickness detection signal from the film thickness sensor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a flow chart showing a film thickness control procedure in a coating film forming method according to the present invention;

DETAILED DESCRIPTION OF THE INVENTION

Preferred embodiments of the present invention will be described below with reference to the accompanying drawings. In the following embodiment, a case wherein a coating film forming apparatus according to the present invention is applied to a resist coating apparatus for semiconductor wafer will be described below.

Figure 2:
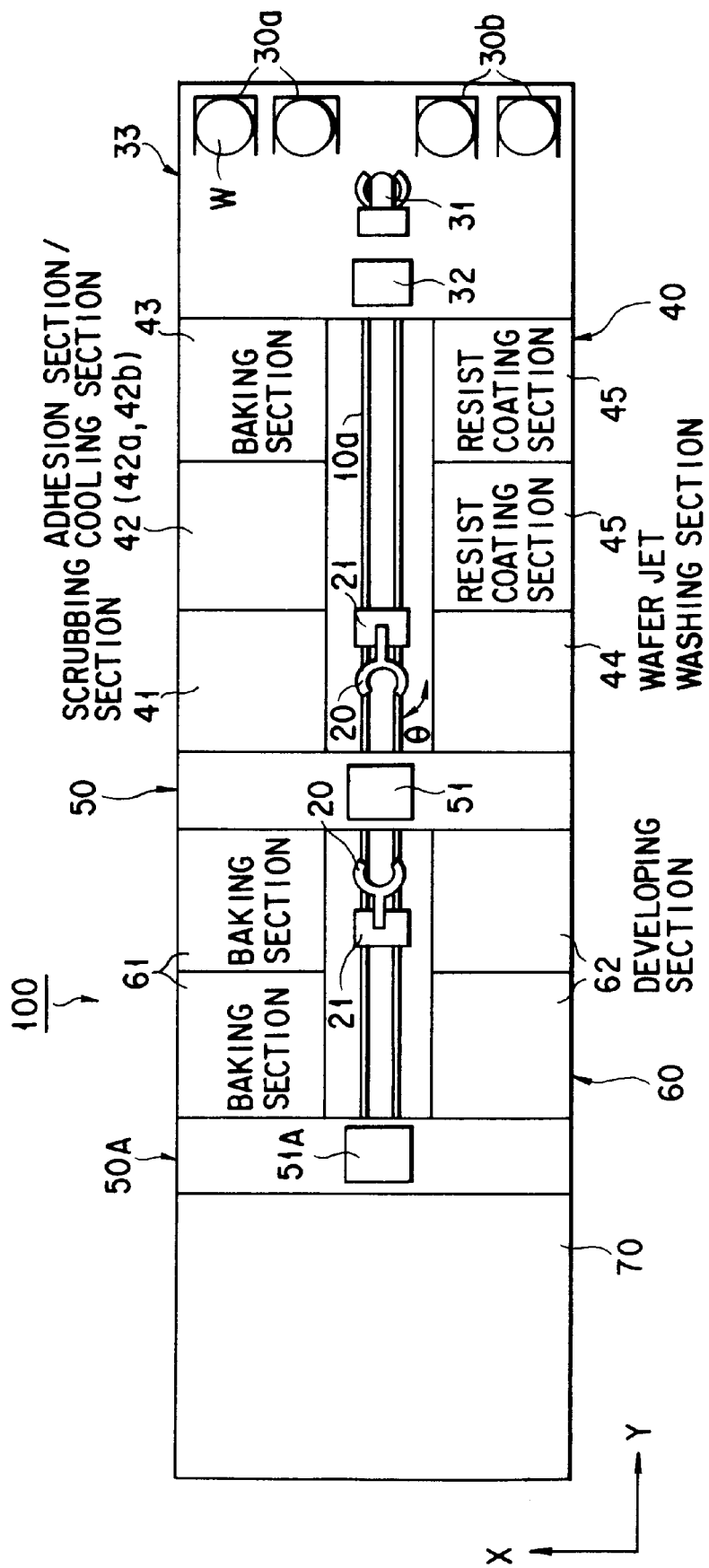
FIG. 2 is a schematic plan view showing the outline of an entire resist liquid coating phenomenon system having a coating film forming apparatus according to the present invention.

As shown in FIG. 2, a resist coating phenomenon process system 100 comprises a cassette station 33, a first process station (resist coating process station) 40, first and second interface sections 50 and 50A, a second process section (development process section) 60, and an exposure device 70.

In the cassette station 33, a sub-arm mechanism 31 and a delivery table 32 are arranged. In the cassette station 33, an unprocessed wafer W is picked out of a first cassette 30a by the sub-arm mechanism 31, and the wafer W is placed on the delivery table 32, positioned, and then unloaded toward the first process station 40. The processed wafer W is loaded by the sub-arm mechanism 31 through the delivery table 32 and stored in a second cassette 30b. The wafer W and the second cassette 30b having the wafer W stored therein are unloaded out of the cassette station 33 by a cassette conveyer (not shown).

The first process station 40 is arranged adjacent to the cassette station 33. The first process station 40 comprises a plurality of process units 41, 42, 43, 44, and 45 for performing an adhesion process, a resist coating process, a pre-baking process, and a cooling process to the wafer W.

At the center of the first process station 40, a linear convey path 10a is arranged. A first main arm mechanism 21 is arranged along the convey path 10a such that the first main arm mechanism 21 can travel along the convey path 10a. The first main arm mechanism 21 can move in the directions of an X axis, a Y axis, and a Z axis, and can be rotated about the Z axis by θ.

The second process station 60 communicates with the first process station 40 through the first interface section 50. The second process station 60 also communicates with the exposure device 70 through the second interface section 50A. The second process station 60 comprises a plurality of process units 61 and 62 for developing and post-baking a coating resist. The exposure device 70 is designed such that a predetermined circuit pattern is exposed on the resist coating film.

The linear convey path 10a is also arranged at the center of the second process station 60. The first main arm mechanism 21 is arranged along the convey path 10a such that the first main arm mechanism 21 can travel along the convey path 10a. The first main arm mechanism 21 can move in the directions of the X axis, the Y axis, and the Z axis, and can rotate about the Z axis by θ.

Along the convey path 10a of the first process station 40, a the brush-washing section 41, the adhesion section/cooing section 42 obtained by stacking an adhesion section 42a and a cooling section 42b on each other, and the baking section (first heat treatment section) 43 are arranged on one side of the convey path 10a. On the other side of the convey path 10a, the jet-water washing section 44 and two resist coating apparatuses 45 are arranged adjacent to each other in a line, the resist coating apparatus 45 and the baking section 43 are arranged opposite to each other through the convey path 10a. Since the resist coating apparatus 45 is spaced apart from the baking section 43 by the convey path 10a as described above, the resist coating apparatus 45 is not easily influenced by heat from the baking section 43, and the resist coating process can be preferably performed.

On one side of the convey path 10a of the second process station 60, two baking sections (second heat treatment sections) 61 are arranged in a line. The baking sections 61 are designed to heat the resist film after exposure. On the other hand, two developing sections 62 are arranged on the other side of the convey path 10a. Since the developing sections 62 are spaced apart from the baking sections 61 by the convey path 10a as described above, the developing sections 62 are not easily influenced by heat from the baking sections 61, and the resist coating process can be preferably performed.

Figure 1:
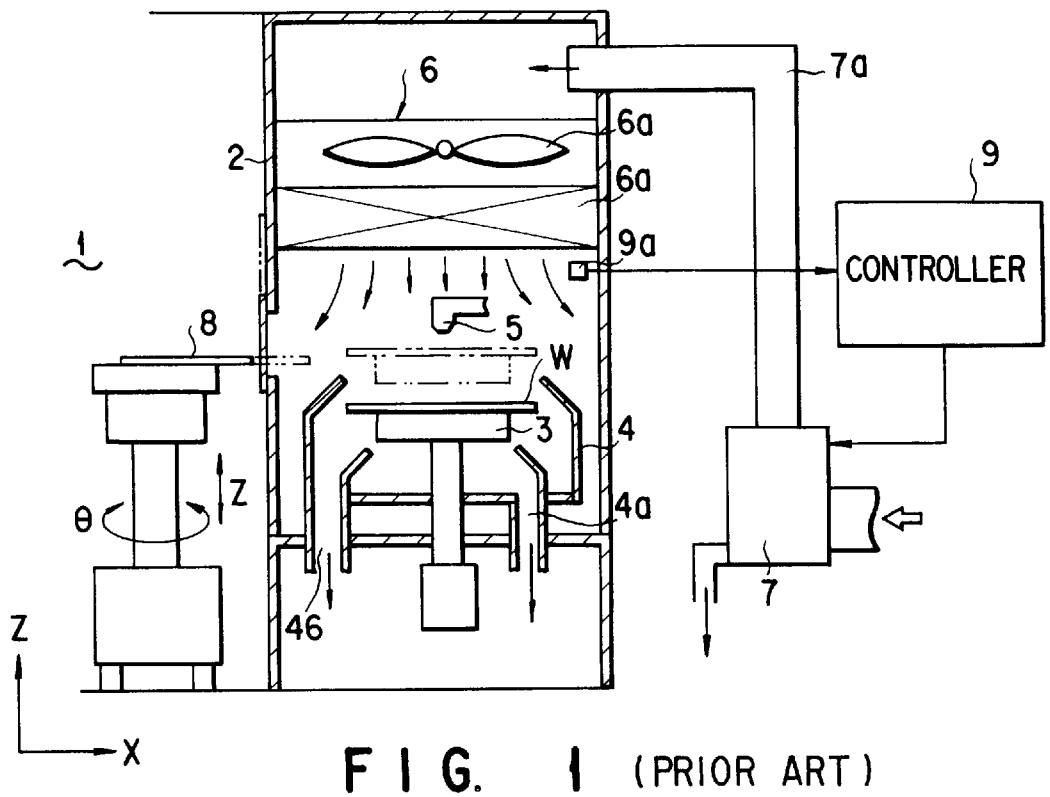
FIG. 1 is a schematic sectional view showing a conventional apparatus.
Figure 3:
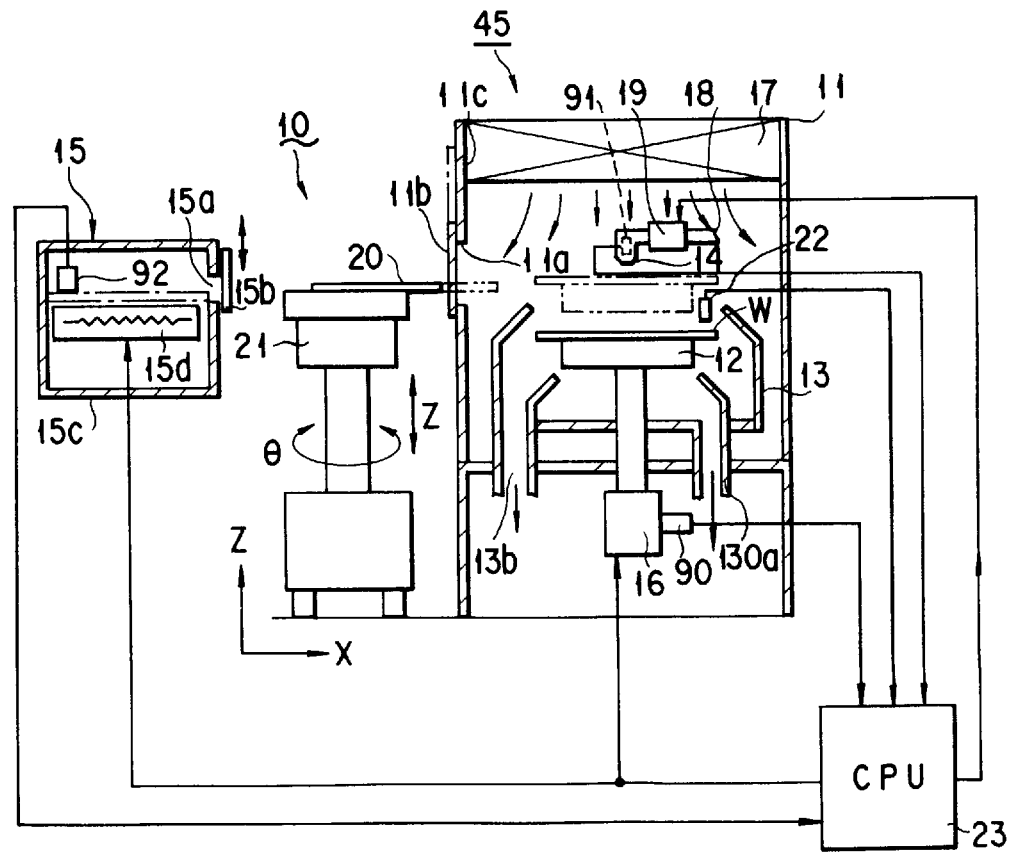
FIG. 3 is a sectional block diagram showing the coating film forming apparatus according to the present invention.

As shown in FIG. 3, the resist coating apparatus 45 comprises a process vessel 11, a spin chuck 12, a drain cup 13, a resist liquid supply nozzle 14, a fan filter unit (FFU) 17, a film thickness sensor 22, and a CPU 23. The interior of the process vessel 11 is partitioned from the atmosphere of a waver convey section 10 by an external panel 11c. The external panel 11c has a wafer loading/unloading port 11a formed therein, and a wafer W is loaded/unloaded through the wafer loading/unloading port 11a. An opening/closing shutter 11b is formed at the wafer loading/unloading port 11a.

The spin chuck 12 rotated by a drive motor 16 is arranged in the process vessel 11. The spin chuck 12 is not only rotated about the Z axis by θ but also can be vertically moved along the Z axis. The drive motor 16 is also connected to the output side of a CPU 23.

A sensor 90 is attached to the motor 16, for detecting the number of revolutions of the spin chuck 12.

The drain cup 13 is arranged to surround the outer periphery and lower portion of the spin chuck 12. A gas outlet port 13a and a liquid outlet port 13b are formed in the bottom portion of the drain cup 13.

The nozzle 14 communicates with a resist liquid supply source (not shown) through a supply pipe 18. A temperature sensor 91 is provided near the outlet port of the nozzle 14, for detecting the temperature of the resist liquid. A resist liquid temperature adjusting unit 19 is attached to the supply pipe 18 immediately near the nozzle 14. The resist liquid temperature adjusting unit 19 has a jacket surrounding the supply pipe 18 such that a thermostatic liquid whose temperature is adjusted is circulated and supplied into the jacket. The resist liquid has a temperature adjusted by the resist liquid temperature adjusting unit 19 and discharged from the nozzle 14 toward the wafer W. A fan and a filter for supplying clean air into the process vessel 11 are incorporated in the FFU 17. The film thickness sensor 22 is arranged near the spin chuck 12 and connected to the input side of the CPU 23. A capacitor sensor is employed as the film thickness sensor 22. In this embodiment, although the film thickness sensor 22 is arranged in the process vessel 11, the film thickness sensor 22 may be arranged outside the coating unit to detect the thickness of a resist film coated on the upper surface of the wafer W.

Outside the resist coating apparatus 45, a wafer temperature adjusting unit (substrate temperature adjustment means) 15 is arranged. A temperature adjusting plate 15d is arranged in a chamber 15c of the wafer temperature adjusting unit 15. A temperature sensor 92 is provided in the chamber 15c, for detecting the surface temperature of the wafer W placed on the temperature adjusting plate 15d. The wafer W is heated or cooled on the temperature adjusting plate 15d to have a temperature which is adjusted to a desired temperature. A wafer loading/unloading port 15a is formed in the chamber 15c, and an opening/closing shutter 15b controlled by the CPU 23 is arranged at the wafer loading/unloading port 15a. A power supply circuit of a heater buried in the temperature adjusting plate 15d is connected to the output side of the CPU 23. A piezo-element (electronic cooling element) buried in the temperature adjusting plate 15d is also connected to the output side of the CPU 23.

The wafer loading/unloading port 11a for a wafer W is formed on one side surface of the process vessel 11, and the opening/closing shutter 11b driven by a cylinder (not shown) is attached to the port 11a. The servo motor 16 is arranged in the lower portion of the process vessel 11, and the spin chuck 12 is rotated by the servo motor 16. Furthermore, a vertical moving means (not shown) for vertically moving the spin chuck 12 is arranged. The power supply circuits of the vertical moving means and the servo motor 16 are connected to the output side of the CPU 23, so that the vertical movement and rotating speed of the spin chuck 12 are controlled at high precision.

A gas outlet path (not shown) communicating with the adsorption side of a vacuum pump (not shown) forms an opening in the upper surface of the spin chuck 12, and the wafer W is held on the upper surface of the spin chuck 12 by vacuum adsorption.

An air feed port 11c communicating with an air supply source (not shown) is formed in the ceiling portion of the process vessel 11. The filter 17 is attached to the air feed port 11c. Supplied air passes through the filter 17 to be cleaned.

The resist supply nozzle 14 is on standby at a position spaced apart from the spin chuck 12 when the resist liquid supply nozzle 14 is not used. The resist liquid supply nozzle 14 is moved to a position immediately below the spin chuck 12 when the resist liquid supply nozzle 14 is used.

The film thickness sensor 22 is arranged in the process vessel 11 to detect the thickness of a resist coating film on the wafer W. A detection signal from the film thickness sensor 22 is input to the CPU 23. On the basis of the input information and correlation data (to be described later), the CPU 23 calculates the optimum rotating speed of the spin chuck, the optimum temperature of the resist liquid, and the optimum temperature of the wafer W. The CPU 23 sends a command signal corresponding to the optimum conditions to the motor 16, the resist liquid temperature adjusting unit 19, and the wafer temperature adjusting unit 15. In this manner, the spin chuck 12 is rotated at the optimum rotating speed, the temperature of the resist liquid is adjusted to the optimum temperature, and the temperature of the wafer W is adjusted to the optimum temperature.

The "correlation data" stored in the CPU 23 in advance is defined as follows. As main parameters which influence the thickness and profile (measure representing the uniformity of a film thickness) of a resist coating film, a resist liquid temperature, a spin chuck rotating speed, and a wafer surface temperature are used. Resists are coated on the wafers W while these parameters are varied, and the film thicknesses of the resultant resist coating films are measured by a film-thickness meter incorporated in the system. On the basis of the film thickness measurement results, resist film thicknesses and profiles corresponding to the parameters are processed by software. The parameters at which a desired resist film thickness and a desired profile can be obtained are the "correlation data".

The thickness of a resist coating film is measured by the film thickness sensor 22 at the following three timings.

First, in an operation of the apparatus, a dummy wafer Wd is held on the spin chuck 12, a resist liquid is coated (supplied) from the resist liquid supply nozzle 14, and the spin chuck 12 is rotated, thereby forming a resist film. Thereafter, the film thickness is measured.

Second, film thicknesses are measured each time a coating process for twenty-five wafers W of one lot is completed.

Third, a film thickness is measured each time a coating process for each wafer W is completed.

As described above, a timing at which the thickness of a resist coating film is measured is not fixed. The timing can be made variable.

Figure 6A:
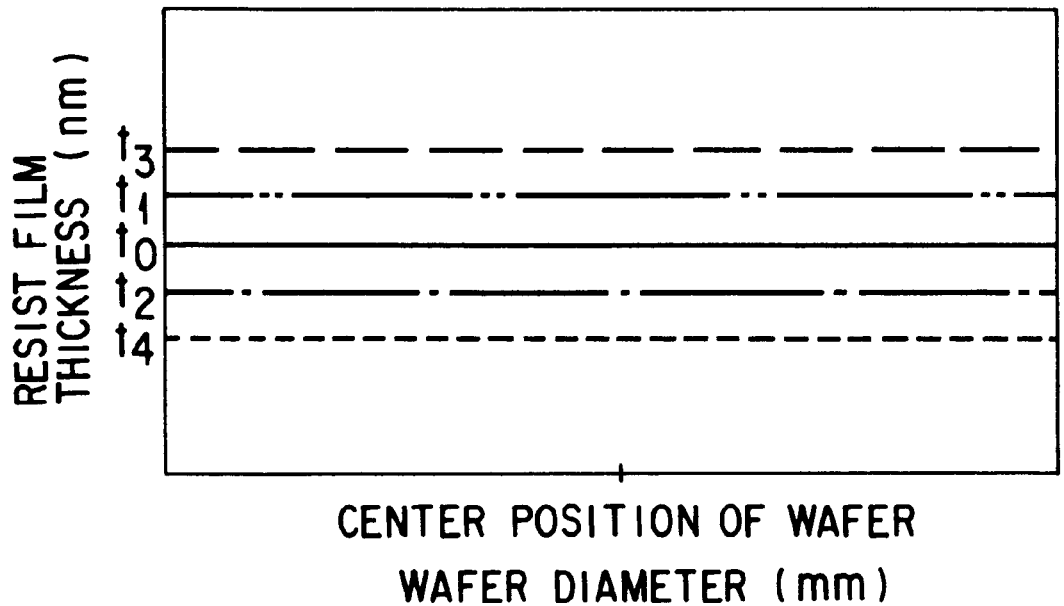
FIG. 6A is a concept view showing a typical resist film thickness for explaining an allowance range of a variation in resist coating film.

A control operation of the thickness of a resist coating film will be described below with reference to FIG. 5 and FIGS. 6A and 6B.

The wafer W is loaded into the process vessel 11 of the resist coating apparatus 45 by the wafer convey arm mechanism 21 and placed on the spin chuck 12, and the shutter 11b is closed. Clean air is supplied from the upper portion to the lower portion in the process vessel 11, and the air is exhausted through the gas outlet port 13a in the lower portion of the cup, thereby forming a downflow of clean air. In this case, the clean air supplied into the process vessel 11 is adjusted in temperature and humidity to have a temperature and a humidity which are optimum for the resist coating process. As described above, the atmosphere around the wafer W is adjusted to an environment suitable for the resist coating process.

A resist liquid is supplied from the resist liquid supply nozzle 14 onto the wafer W, and the spin chuck 12 is rotated at a predetermined rotating speed for a predetermined period of time to diffuse the resist liquid over the entire surface of the wafer W, thereby forming a resist coating film.

After the resist coating film is formed as described above, the spin chuck 12 is stopped, and the thickness of the resist coating film is detected in the following procedure. While the film thickness sensor 22 and the spin chuck 12 are relatively moved, the thicknesses of the resist coating film at a plurality of arbitrary portions (e.g., forty portions in one wafer) of the wafer W are detected by the sensor 22 (step S17 (steps S27 and S37)). The CPU 23 checks whether the detected film thicknesses are set within a predetermined range (step S17-1). More specifically, as shown in FIG. 6A, the CPU 23 checks whether the detection thickness value is set within the range ($t_1$–$t_2$) of an allowance upper limit value $t_1$ (nm) to an allowance lower limit value $t_2$ (nm) with respect to an ideal film thickness t0 (nm) (step S17-1). If NO in step S17-1, the set rotating speed of the servo motor 16 is corrected to set the thickness of the resist coating film within the allowance range $t_1$–$t_2$ (step S18). For example, if the detection thickness value is larger than $t_3$ (nm), the set rotating speed of the motor 16 is increased. In contrast to this, if the measured thickness value is smaller than $t_4$ (nm), the set rotating speed of the motor 16 is decreased. The detection thickness values for starting a control operation are set to be $t_3$ and $t_4$, respectively, and the allowance upper and lower limit values $t_1$ and $t_2$ are not employed as the detection thickness values. This is because delay of response to the control operation is considered.

Figure 6B:
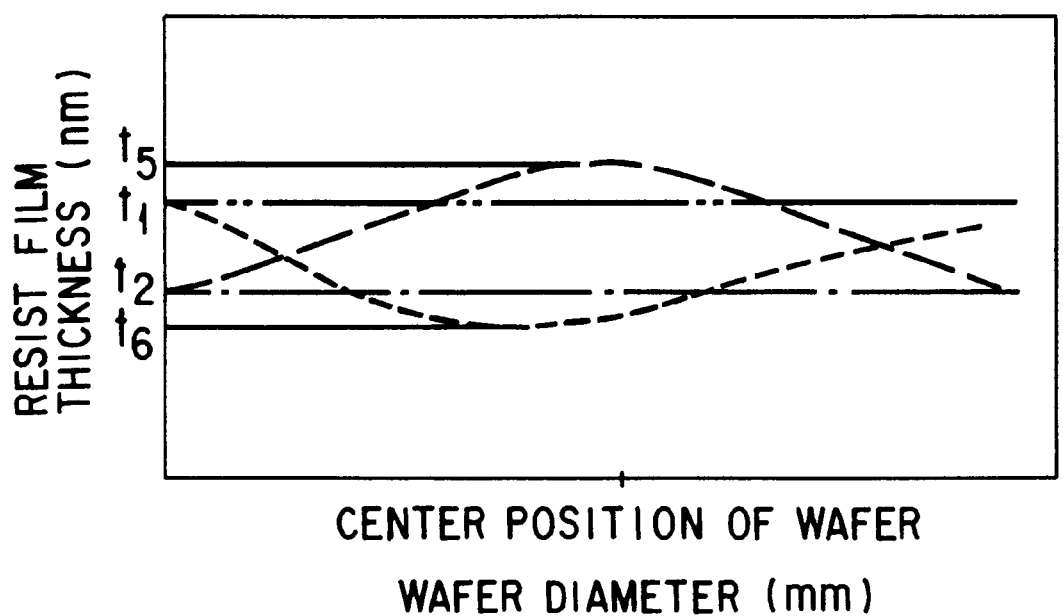
FIG. 6B is a thickness distribution view showing various profiles of a resist coating film.

The CPU 23 checks whether the thickness of the resist film is uniform, i.e., as shown in FIG. 6B, whether the profile of the resist coating film is set within the range of $t_1$ to $t_2$ (nm) (step S17-2). If the profile of the resist film is out of the range of $t_1$ to $t_2$ (nm), at least one of adjustment of the temperature of the resist liquid and adjustment of the temperature of the wafer W is performed to make the film thickness uniform (steps S18-1 and S18-2). For example, a thickness $t_5$ (nm) of the central portion of the wafer W is large, the temperature of the resist liquid is decreased, or the temperature of the wafer W is increased. On the other hand, a thickness $t_6$ (nm) of the central portion of the wafer W is small, the temperature of the resist liquid is increased, or the temperature of the wafer W is decreased.

The detection film thickness data is fedback to the subsequent resist coating process (steps 27 and 37), and the spin chuck rotating speed, the resist liquid temperature, and the wafer surface temperature are controlled to obtain an optimum film thickness and an optimum profile.

With the above control operation, the thickness of the resist film formed on the surface of the wafer W can be set within the allowance range $t_1$ to $t_2$ (nm), and the profile of the resist film can be made preferable.

In the above description, after it is checked whether the film thickness is set within a predetermined film thickness range, it is checked whether the film thickness is uniform. However, this order may be reversed. More specifically, after it is checked whether the film thickness is uniform, it may be checked whether the film thickness is set within the predetermined film thickness range.

The resist coating apparatus according to the present invention is incorporated in the resist coating phenomenon system described above. However, the resist coating apparatus can be used as an independent apparatus.

A case wherein a wafer W is subjected to a resist process by using the above system will be described below with reference to the flow charts in FIGS. 4 and 5 and the views in FIGS. 2 and 3.

An unprocessed wafer W1 (first wafer) is removed from the cassette 30a by the sub-arm mechanism 31, placed on the delivery table 32, and centered. The wafer W1 is picked up from the delivery table 32 by a main convey arm mechanism 20, and loaded from the cassette station 33 into the first process station 40 (step S11). The wafer W1 is brush-washed by the brush-washing section 41 and jet-water-washed by the jet-water washing section 44. The wafer W1 is heated by an adhesion section 42a and brought into contact with hexamethyl disilane (HMDS) to be subjected to an adhesion process (step S12).

Upon completion of the adhesion process, the wafer W1 is cooled by the cooling section 42b and adjusted in temperature by the wafer temperature adjusting unit 15 to have a temperature of, e.g., 23° C. (step S13).

Thereafter, the wafer W1 is loaded into the process vessel 11 of the resist coating apparatus 45 and placed on the spin chuck 12, and the opening/closing shutter 11b is closed. Clean air is supplied from the upper portion to the lower portion in the process vessel 11, and the air is exhausted through the gas outlet port 13a in the lower portion of the cup, thereby forming a downflow of clean air. In this case, the clean air supplied into the process vessel 11 is adjusted in temperature and humidity to have a temperature and a humidity which are optimum for the resist coating process. As described above, the atmosphere around the wafer W is adjusted to an environment suitable for the resist coating process.

The nozzle 14 is located above the spin chuck 12, and a resist liquid is poured onto the upper surface of the wafer W, and the wafer W is rotated. In this manner, a resist coating film having a desired thickness is formed on the upper surface of the wafer W1 (step S14).

Immediately after the resist coating step (S14), thinner is poured from a lower surface washing nozzle (not shown) onto the rear surface (lower surface) of the wafer W1. When the wafer W1 is rotated, the thinner and the resist adhered to the rear surface are centrifugally removed from the rear surface of the wafer W1.

After the resist coating process, the wafer W1 is conveyed onto a delivery table 51 of the interface section 50, picked up by the wafer convey arm 20 of the developing process station 60, and conveyed onto a table 51A of the interface section 50A. The wafer W is positioned on the table 51A, conveyed into the exposure device 70, and subjected to an exposure process in the exposure device 70.

Upon completion of the exposure process, the wafer W is conveyed into the baking section 61 of the development process section 60 through the interface section 50A and heated in the baking sections 61 to be pre-baked. Upon completion of the pre-baking process, the wafer W is conveyed into the developing section 62 and subjected to a development process in the developing section 62. Upon completion of development process, the wafer W is conveyed into the baking section 61 again and heated to be post-baked. With this post-baking process, the pattern strength of the resist coating film is improved.

Upon completion of the post-baking process, the wafer W is conveyed onto the delivery table 32 of the cassette station 33 and stored in the cassette 30b by the convey arm mechanism 31. When the-cassette 30b is filled with processed wafers W, the processed wafers W are unloaded from the system while the wafers W are stored in the cassette 30b. In this manner, the series of resist processes for the wafer W are completed.

In the coating phenomenon system, conditions used when a resist is coated on a product wafer W is set in advance by using any one of the following tree methods, and a resist coating film is formed according to the set conditions. In this manner, the thickness of the resist coating film can be made highly precise and uniform.

According to the first method, before the coating phenomenon system is operated (resist coating process for product wafer W), a dummy wafer Wd is placed on the spin chuck 12, a resist liquid is poured from the nozzle 14 onto the dummy wafer Wd to form a resist coating film on the dummy wafer Wd. The film thickness is measured, correlation data between coating conditions (spin chuck rotating speed, resist liquid temperature, wafer temperature, and the like) and the measured film thickness is kept.

According to the second method, after all resist coating phenomenon processes for twenty-five product wafers W of one lot are completed, a resist coating film is formed on the dummy wafer Wd. The thickness of the resist coating film is measured, and correlation data between the coating conditions and the measured film thickness is kept.

According to the third method, after resist coating processes for the product wafers W are completed, the thicknesses of the resist coating films formed on the wafers W are measured, and correlation data between the coating conditions and the measured film thicknesses is kept.

When the correlation data is to be kept, the thickness of the resist coating film is preferably measured after the resist coating film formed on the dummy wafer Wd or the product wafer W is heated by the baking section 43 and cooled. This is because a solvent contained in the resist coating film is removed (evaporated) by baking, and the thickness of the resist coating film becomes stable. Therefore, the film thickness sensor 22 is not arranged in the resist coating apparatus 45, and is preferably arranged outside the resist coating apparatus 45. For example, the film thickness sensor 22 is preferably attached to the wafer convey arm mechanism 20.

In the first method, a resist coating film whose thickness has been measured is completely removed from the dummy wafer Wd, and the dummy wafer Wd can be used for forming the correlation data again.

Figure 7:
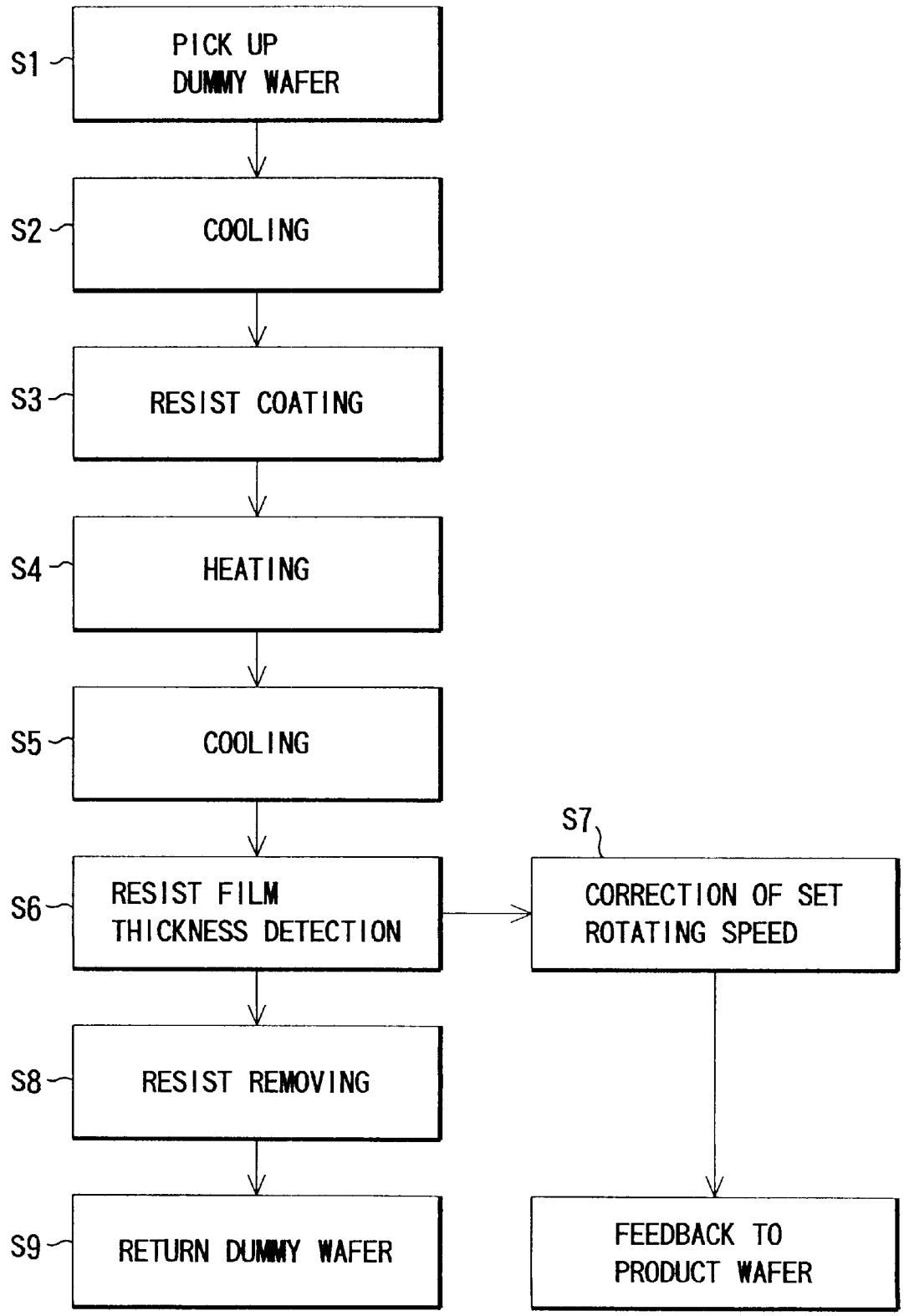
FIG. 7 is a flow chart showing the step of measuring the thickness of a resist coating film by using a measuring substrate according to the present invention.

A case wherein the dummy wafer Wd is used to form the correlation data, and the same dummy wafer Wd is used to form other correlation data again will be described below with reference to FIGS. 7 and 8.

Figure 8:
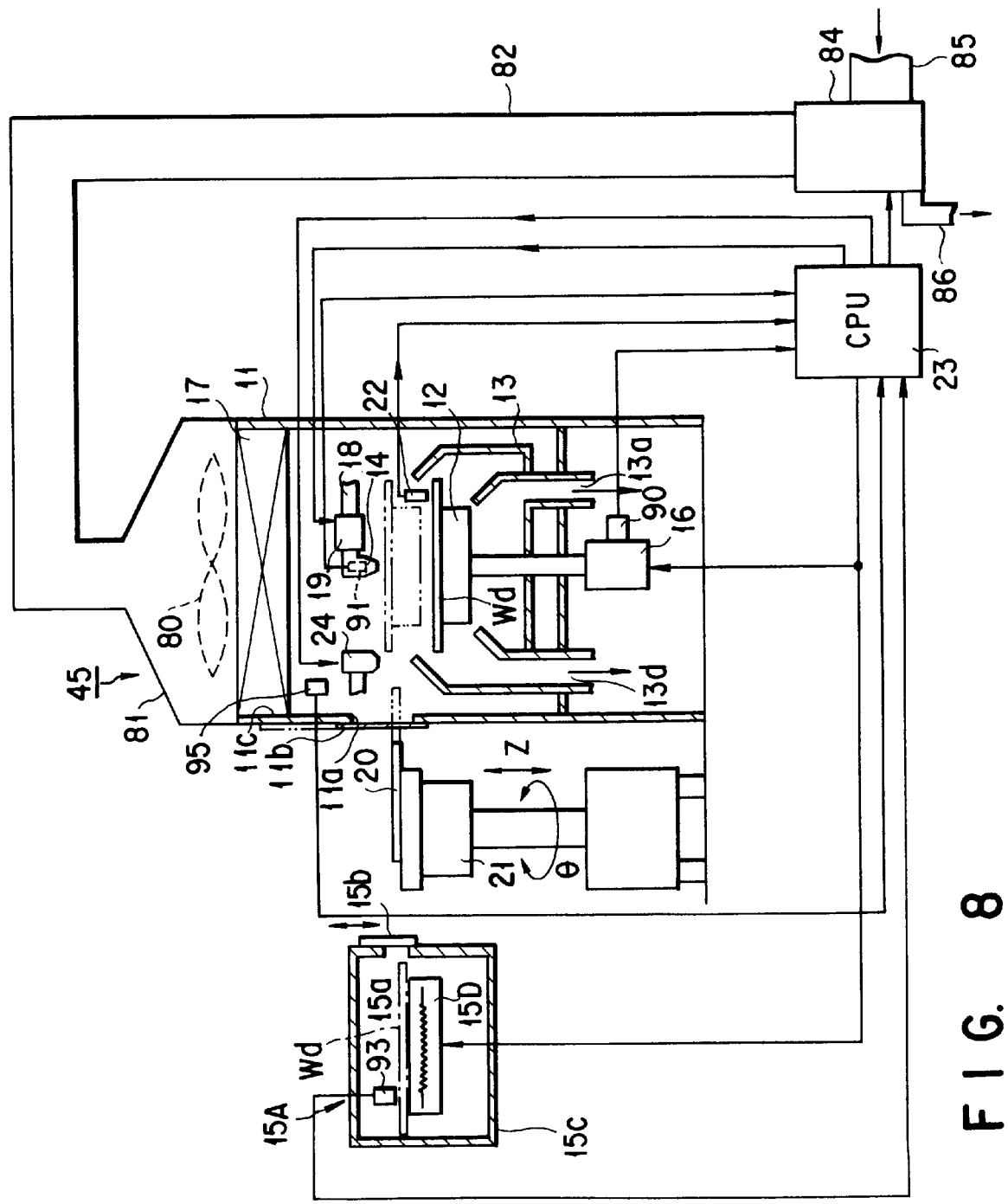
FIG. 8 is a sectional block diagram showing a coating film forming apparatus according to another embodiment of the present invention.

As shown in FIG. 8, a hood 81 is arranged on the upper portion of the process vessel 11 of the resist coating apparatus 45. The hood 81 is detachably arranged on the process vessel 11. A fan 80 and the FFU 17 are arranged in the hood 81. The hood 81 communicates with the blower 84 through a duct 82. The blower 84 communicates with an air supply source (not shown) through a duct 85. The blower 84 has a drain 86. The output side of the CPU 23 is connected to the power supply circuit of the blower 84.

A sensor 95 is provided near the air-outlet port of the FFU 17, for detecting the temperature and humidity of the air.

The resist liquid supply nozzle 14 and a thinner supply nozzle 24 are arranged in the process vessel 11. The nozzle 24 communicates with a thinner tank (not shown) through a supply pipe 25 and a mass-flow controller (not shown). The nozzle 24 is supported by a nozzle moving mechanism (not shown) such that the nozzle 24 can be moved between the upper position and standby position of the spin chuck 12. The nozzle moving mechanism and the mass-flow controller are connected to the output side of the CPU 23, and the timings of the nozzle moving operation and the thinner supply operation are controlled by the CPU 23.

A dummy wafer temperature adjusting unit 15A is arranged near the resist coating apparatus 45, and a dummy wafer Wd is placed on the stage 15D. The dummy wafer stage 15D has a heating means and a cooling means which are arranged to adjust the temperature of the dummy wafer Wd.

A procedure of forming correlation data will be described below.

A dummy wafer Wd is picked up from the dummy wafer stage 15D by the convey arm mechanism 20 (step S1) and conveyed into the cooling section 42b to be cooled to a predetermined temperature (step S2). Upon completion of the cooling process, the dummy wafer Wd is conveyed into the resist coating apparatus 45 and placed on the spin chuck 12 to be held by adsorption. A process atmosphere around the dummy wafer Wd is adjusted.

A resist liquid is supplied from the nozzle 14 onto the upper surface of the dummy wafer Wd, and the spin chuck 12 is rotated, thereby forming a resist coating film on the upper surface of the dummy wafer Wd (step S3).

The dummy wafer Wd is loaded into the baking section 43 and heated under predetermined conditions to bake the resist coating film (step S4). The baked dummy wafer Wd is cooled to room temperature (step S5), and the thickness of the resist coating film is detected by the film thickness sensor 22 (step S6). When a detection signal is sent from the film thickness sensor 22 to the CPU 23, the CPU 23 retrieves preliminary correlation data from the memory section, and the CPU 23 calculates the correction amount of the set rotating speed of the motor on the basis of the preliminary correlation data and the detection film thickness information. The CPU 23 sends a signal corresponding to the correction amount of the motor set rotating speed to the power supply circuit of the drive motor 16 to correct the rotating speed of the spin chuck 12 (step S7).

Here, the "preliminary correlation data" is data which has been obtained with respect to correlation between the resist coating conditions (the rotating speed of the wafer, the temperature of the resist liquid, and the wafer surface temperature) and the measured film thickness by using the dummy wafer Wd at another position (e.g., in an experiment room).

In step S7 described above, not only the set rotating speed of the spin chuck driving motor, but also the temperature of the supplied resist liquid and the surface temperature of the wafer may be controlled.

As described above, the film thickness detection information is fedback to the resist coating step for the next product wafer W to correct the set rotating speed of the drive motor 16, the temperature of the supplied resist liquid, and the surface temperature of the wafer, thereby making the thickness of a resist film formed on the next product wafer W highly precise.

A Upon completion of the film thickness detection, te resist coating film is removed from the dummy wafer Wd (step S8), and the dummy wafer Wd is caused to be return onto the dummy wafer stage 15A (step S9). The dummy wafer W which returns can be used again to form next preliminary correlation data. In this case, the dummy wafer Wd may be conveyed into the resist coating apparatus 45 and poured with thinner from the nozzle 24 to remove the resist coating film from the dummy wafer Wd.

Figure 4:
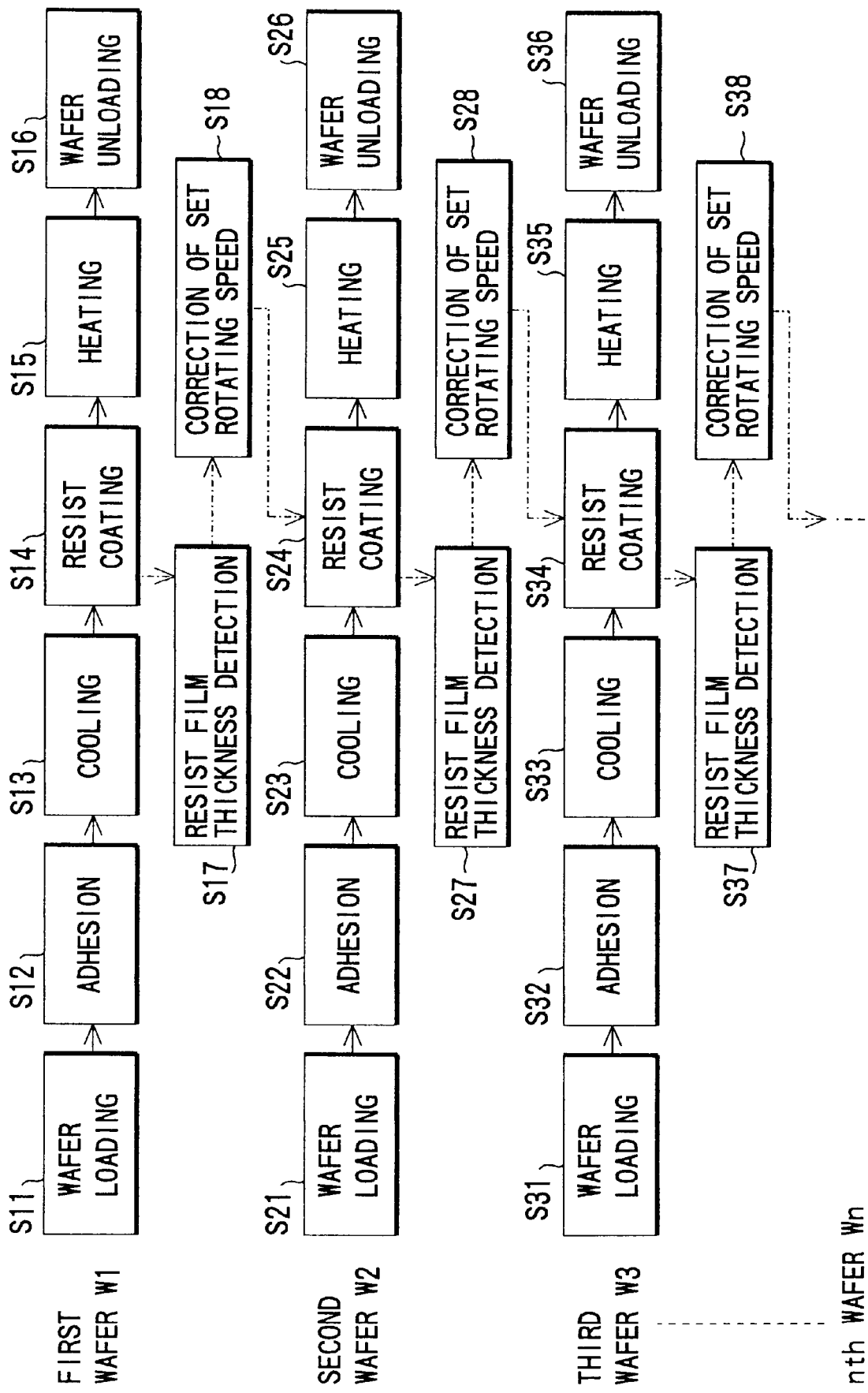
FIG. 4 is a flow chart showing a series of processing steps for detecting the thickness of a coating film on each substrate.

In the third embodiment, the thickness of a resist film formed on the first wafer W1 is detected by the sensor 22 in step S17 shown in FIG. 4, and the CPU 23 corrects the set rotating speed of the servo motor 16 on the basis of the film thickness detection result (step S18). The spin chuck 12 is rotated at the corrected set rotating speed, and a resist is coated on a second wafer W2 (step S24). Similarly, the thickness of the resist film formed on the second wafer W2 is detected by the sensor 22 (step S27), and the CPU 23 corrects the set rotating speed of the drive motor 16 on the basis of the film thickness detection result (step S28). The spin chuck 12 is rotated at the corrected set rotating speed, and a resist is coated on a third wafer W3 (step S34). Similarly, the thickness of the resist film formed on the third wafer W3 is detected by the sensor 22 (step S37), and the CPU 23 corrects the set rotating speed of the drive motor 16 on the basis of the film thickness detection result (step S38). While the spin chuck 12 is rotated at the corrected set rotating speed, a resist is coated on a fourth wafer W4.

When the detection value detected by the film thickness sensor 22 is out of a proper range which has been stored, for example, when the film thickness sensor 22 is out of order, a program is preferably formed to cause a lamp or alarm buzzer to inform an operator that the film thickness sensor 22 is out of order and to output a command for stooping the operation of the resist coating apparatus 45.

As described above, when the film thickness of the resist coating film on each wafer W is detected, and resist coating operations for subsequent product wafers W are sequentially controlled on the basis of the detection information, resist coating films having higher precision can be obtained.

EXAMPLES

In order examine an effect obtained by the film thickness control described above, an experiment for coating a resist liquid on a silicon wafer W under the following conditions was performed. In this case, the results shown in Table 1 were obtained with respect to Examples 1 to 4.
Experiment Conditions Example 1

An external environment temperature was consciously changed from 22° C. to 24° C. (assume that no atmospheric temperature/humidity adjusting device was used).

Example 2

An external environment temperature was consciously changed from 24° C. to 22° C. (assume that no atmospheric temperature/humidity adjustment device was used).

Example 3

An external environment humidity was consciously changed from 40% to 35% (assume that no atmospheric temperature/humidity adjustment device was used).

Example 4

An external environment humidity was consciously changed from 35% to 40% (assume that no atmospheric temperature/humidity adjustment device was used).

A resist liquid was coated on twenty-five wafers under the above experiment conditions to obtain samples according to Examples 1 to 4. The results shown in Table 1 were obtained from the samples of the Examples.

TABLE 1

|  | External Environmental Atmosphere State | Film Thickness Range (nm) |
| --- | --- | --- |
| Example 1 | Temperature: 22° C. to 24° C. | 7.6 |
| Example 2 | Temperature: 24° C. to 22° C. | 5.7 |
| Example 3 | humidity: 40% to 35% | 4.3 |
| Example 4 | humidity: 35% to 40% | 6.1 |
| Comparative Example |  | 10.0 |

In Comparative Example, a resist was coated on twenty-five wafers W by using a conventional method in which film thickness adjustment was not performed, and the film thickness range was calculated. Here, the "film thickness range" is the difference between the maximum and minimum values of the thicknesses of the resist coating films. It is true that the thickness of the resist coating film becomes uniform as the film thickness range decreases. As is apparent from the above results, it was found that the film thickness range (10 nm) was smaller than the film thickness ranges (7.6 nm, 5.7 nm, 4.3 nm, and 6.1 nm) in Examples 1 to 4. More specifically, the film thickness ranges of Examples 1 to 4 reduce to about half of the film thickness range of Comparative Example (conventional method).

According to the present invention, the thickness of a resist coating film can be made high precise and uniform without using an atmospheric temperature/humidity adjustment device.

Although the embodiment describes the case wherein the present invention is applied to a coating phenomenon processing system for semiconductor wafer, the present invention can also be applied to another substrate such as an LCD glass substrate.

According to the present invention, the effects as described in (1) to (3) can be obtained.

(1) The thickness of a resist coating film formed on a substrate surface is detected in a coating film forming apparatus, and, on the basis of the detection information, the rotating speed of the substrate, the temperature of a resist liquid, and the temperature of the substrate are adjusted. In this manner, the thickness of the resist coating film can be made close to a target thickness, and the film thickness can be made uniform. For this reason, the thickness of the resist coating film can be controlled without a special dedicated atmospheric temperature/humidity adjustment device. Therefore, the apparatus can be reduced in size.

(2) The thickness of a resist coating film formed on a dummy wafer is measured, and, on the basis of the detection information, the rotating speed of the wafer, the temperature of a resist liquid, and the temperature of the wafer are adjusted. For this reason, the dummy wafer can be effectively used, and a yield of production wafers can be improved.

(3) After the thickness of a resist coating film formed on a dummy wafer is measured, the resist coating film is removed from the dummy wafer, and a resist coating film is formed on the dummy wafer again. When the thickness of the resist coating film is measured, the dummy wafer can be effectively used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A coating film forming method for forming a resist coating film on an upper surface of a substrate held by a spin chuck in a chamber to which a downflow of clean air is supplied, comprising:

(a) the step of keeping preliminary correlation data representing correlation between a rotating speed of said substrate, a temperature of at least one of a resist liquid to be coated and the upper surface of said substrate, and the thickness of the resist coating film formed on said substrate in said chamber;

(b) the step of conveying said substrate into said chamber and holding said substrate by said spin chuck;

(c) the step of pouring the resist liquid onto said substrate and spin-rotating said substrate to form a resist coating film on the upper surface of said substrate;

(d) the step of detecting the thickness of the resist coating film formed on the upper surface of said substrate by film thickness detection means;

(e) the step of detecting a rotating speed of said spin chuck by rotating speed detection means, and of detecting a temperature of at least one of the resist liquid to be coated and the upper surface of the substrate by temperature detections means; and (f) the step of, on the basis of the detected film thickness, the detected rotating speed, the detected temperature of at least one of the resist liquid to be coated and the upper surface of the substrate, and the preliminary correlation data, correcting a set rotating speed of said spin chuck to feedback-control a resist coating process for a next substrate.

2. A method according to claim 1, wherein the step (e) further comprises the step of detecting the temperature of the resist liquid immediately before the resist liquid is coated on said substrate; and the step (f) further comprises the step of correcting the temperature of a resist liquid to be coated on a next substrate on the basis of the detected temperature, the detected film thickness, and the preliminary correlation data.

3. A method according to claim 1, wherein the step (e) further comprises the step of detecting the temperature of the upper surface of said substrate immediately before a resist liquid is coated on said substrate; and the step (f) further comprises the step of correcting the temperature of an upper surface of a next substrate on the basis of the detected temperature, the detected film thickness, and the preliminary correlation data.

4. A method according to claim 1, wherein after the resist coating film is heated by baking and then cooled, the thickness of the resist coating film is measured in the film thickness detection step (d).

5. A method according to claim 1, wherein the thickness of the resist coating film is detected in said chamber in the step (d), on the basis of the detection information, thicknesses of resist coating films on subsequent substrates are sequentially controlled.

6. A method according to claim 1, wherein in the step (d), thicknesses of the resist coating film at a plurality of positions while said substrate on said spin chuck and said thickness detection means are relatively moved.

7. A method according to claim 1, wherein the thickness of the resist coating film in the step (d) is measured each time resist coating is performed to twenty-five substrates of one lot.

8. A method according to claim 1, wherein the thickness of the resist coating film in the step (d) is measured each time resist coating is performed to each substrate.

9. A method according to claim 1, wherein an atmosphere in said chamber is controlled before the step (c) to adjust an atmosphere around said substrate on said spin chuck to an atmosphere suitable for a resist coating process.

10. A coating film forming method for forming a resist coating film on an upper surface of a substrate held by a spin chuck in a chamber to which a downflow of clean air is supplied, comprising:

(A) the step of keeping primary correlation data representing correlation between a rotating speed of a dummy substrate rotated by said spin chuck, a temperature of at least one of a resist liquid to be coated and the upper surface of the substrate, and the dummy thickness of the resist coating film formed on said substrate in said chamber;

(B) the step of conveying said product substrate into said chamber and holding said product substrate by said spin chuck;

(C) the step of pouring the resist liquid onto said product substrate and spin rotating said product substrate to form a resist coating film on the upper surface of said product substrate;

(D) the step of detecting the thickness of the resist coating film formed on the upper surface of said product substrate by film thickness detection means;

(E) the step of detecting the rotating speed of said spin chuck by rotating speed detection means, and of detecting a temperature of at least one of the resist liquid to be coated and the upper surface of the substrate by temperature detection means; and (F) the step of, on the basis of detected film thickness, the detected rotating speed, the detected temperature of at least one of the resist liquid to be coated and the upper surface of the substrate, and the preliminary correlation data, correcting a set rotating speed of said spin chuck to feedback-control a resist coating process for a next product substrate.

11. A method according to claim 10, wherein the step (E) further comprises the step of detecting the temperature of the resist liquid immediately before the resist liquid is coated on said product substrate; and the step (F) further comprises the step of correcting the temperature of a resist liquid to be coated on a next product substrate on the basis of the detected temperature, the detected film thickness, and the preliminary correlation data.

12. A method according to claim 10, wherein
the step (E) further comprises the step of detecting the temperature of the upper surface of said product substrate immediately before a resist liquid is coated on said product substrate; and
the step (F) further comprises the step of correcting the temperature of an upper surface of a next product substrate on the basis of the detected temperature, the detected film thickness, and the preliminary correlation data.

13. A method according to claim 10, wherein
after the resist coating film is heated by baking and then cooled, the thickness of the resist coating film is measured in the film thickness detection step (D).

14. A method according to claim 13, wherein
after the thickness of the resist coating film formed on said dummy substrate is detected, the resist coating film is removed from said dummy substrate, and said dummy substrate is used in the step (A) again to keep another preliminary correlation data.

15. A method according to claim 10, wherein
after the thickness of the resist coating film formed on said dummy substrate is detected, the resist coating film is removed from said dummy substrate, and said dummy substrate is used in the step (A) again to keep another preliminary correlation data.

16. A method according to claim 10, wherein
an atmosphere in said chamber is controlled before the step (C) to adjust an atmosphere around said substrate on said spin chuck to an atmosphere suitable for a resist coating process.

17. A method according to claim 10, wherein
the thickness of the resist coating film in the step (D) is measured each time resist coating is performed to twenty-five substrates of one lot.

18. A method according to claim 10, wherein
the thickness of the resist coating film in the step (D) is measured each time resist coating is performed to each substrate.

19. A method according to claim 10, wherein
in the step (D), thicknesses of the resist coating film at a plurality of positions while said substrate on said spin chuck and said thickness detection means are relatively moved.

20. A coating film forming apparatus for supplying a resist liquid onto an upper surface of a substrate and spin-rotating said substrate to form a resist coating film on the upper surface of said substrate, comprising:

a chamber to which a downflow of clean air is supplied;
a spin chuck, arranged in said chamber, for holding said substrate;
rotational driving means for spin-rotating said spin chuck;
resist liquid supply means for supplying the resist liquid to said substrate on said spin chuck;
a film thickness sensor, arranged in said chamber, for detecting the thickness of a resist coating film formed on the upper surface of said substrate;
at least one of a first temperature sensor for detecting a temperature of the resist liquid and a second temperature sensor for detecting a surface temperature of the substrate;
at least one of first temperature adjustment means for adjusting the temperature of a resist liquid to be coated on said substrate and second temperature adjustment means for adjusting the surface temperature of the substrate; and
control means for controlling said rotational driving means on the basis of a film thickness detection signal from said film thickness sensor, and for controlling said first temperature adjustment means on the basis of a temperature signal supplied from said first temperature detector and the film thickness signal supplied from said film thickness sensor, and for controlling said second temperature adjustment means on the basis of a surface temperature signal supplied from said second temperature sensor and the film thickness signal supplied from said film thickness sensor.

21. An apparatus according to claim 20, further comprising
third temperature adjustment means for adjusting the temperature of a dummy substrate used to keep preliminary correlation data representing correlation between the temperature of said dummy substrate and the thickness of a resist coating film to be formed on said substrate.

22. An apparatus according to claim 21, further comprising
solvent supply means for pouring a solvent for removing the resist coating film formed on the upper surface of said dummy substrate onto said dummy substrate.

23. An apparatus according to claim 20, further comprising
a rotating speed detection sensor for detecting a rotating speed of said spin chuck.

* * * * *